United States Patent [19]

Takano

[11] Patent Number: 4,890,099

[45] Date of Patent: Dec. 26, 1989

[54] SIGNAL ANALYZER HAVING PARTIALLY SCROLLING FUNCTION FOR DISPLAY SCREEN

[75] Inventor: Mitsuyoshi Takano, Tokyo, Japan

[73] Assignee: Anritsu Corporation, Tokyo, Japan

[21] Appl. No.: 163,022

[22] Filed: Mar. 2, 1988

[30] Foreign Application Priority Data

Mar. 6, 1987 [JP] Japan .................................. 62-51708

[51] Int. Cl.⁴ ............................................. G09G 1/00
[52] U.S. Cl. .................................... 340/724; 340/726; 324/77 B
[58] Field of Search ............... 340/723, 724, 726, 792; 364/485, 518, 521; 324/77 B

[56] References Cited

U.S. PATENT DOCUMENTS 4,244,024  1/1981  Marzalek et al. .
4,257,104  3/1981  Martin et al. .
4,611,164  9/1986  Mitsuyoshi et al. .

FOREIGN PATENT DOCUMENTS 165036  12/1985  European Pat. Off. .

OTHER PUBLICATIONS

Control and Instrumentation; vol. 13, No. 4, Apr. 1981; pp. 50–51.
Toute L'Electronique, No. 493; Apr. 1984; pp. 21–26.
Elektronik, vol. 29, No. 2, 24th Jan. 1980; pp. 31–38.

Primary Examiner—Gerald Brigance
Assistant Examiner—Jeffery A. Brier
Attorney, Agent, or Firm—Frishauf, Holtz, Goodman & Woodward

[57] ABSTRACT

An input processing section outputs a digital signal corresponding to a frequency sweep range of an input signal. A memory stores the digital signal. A display displays the digital signal stored in the memory as an image which is developed along a frequency axis. A scroll command section provides a command for shifting the image. A controller supplies, prior to the command, control signals to the input processing section, for causing the input processing section to process the input signal in a first frequency sweep range and supplies, and to the memory, for causing the memory to store the digital signal. When the command is received, the controller supplies control signals to the input processing section for causing the input signal to be processed in a second frequency sweep range in accordance with a content of the command, and to the memory for causing an address range of the memory to shift and the memory to store the obtained digital signal. The display displays an image of the second frequency sweep range continuously with the image of the first frequency sweep range which is shifted in accordance with the command.

14 Claims, 7 Drawing Sheets

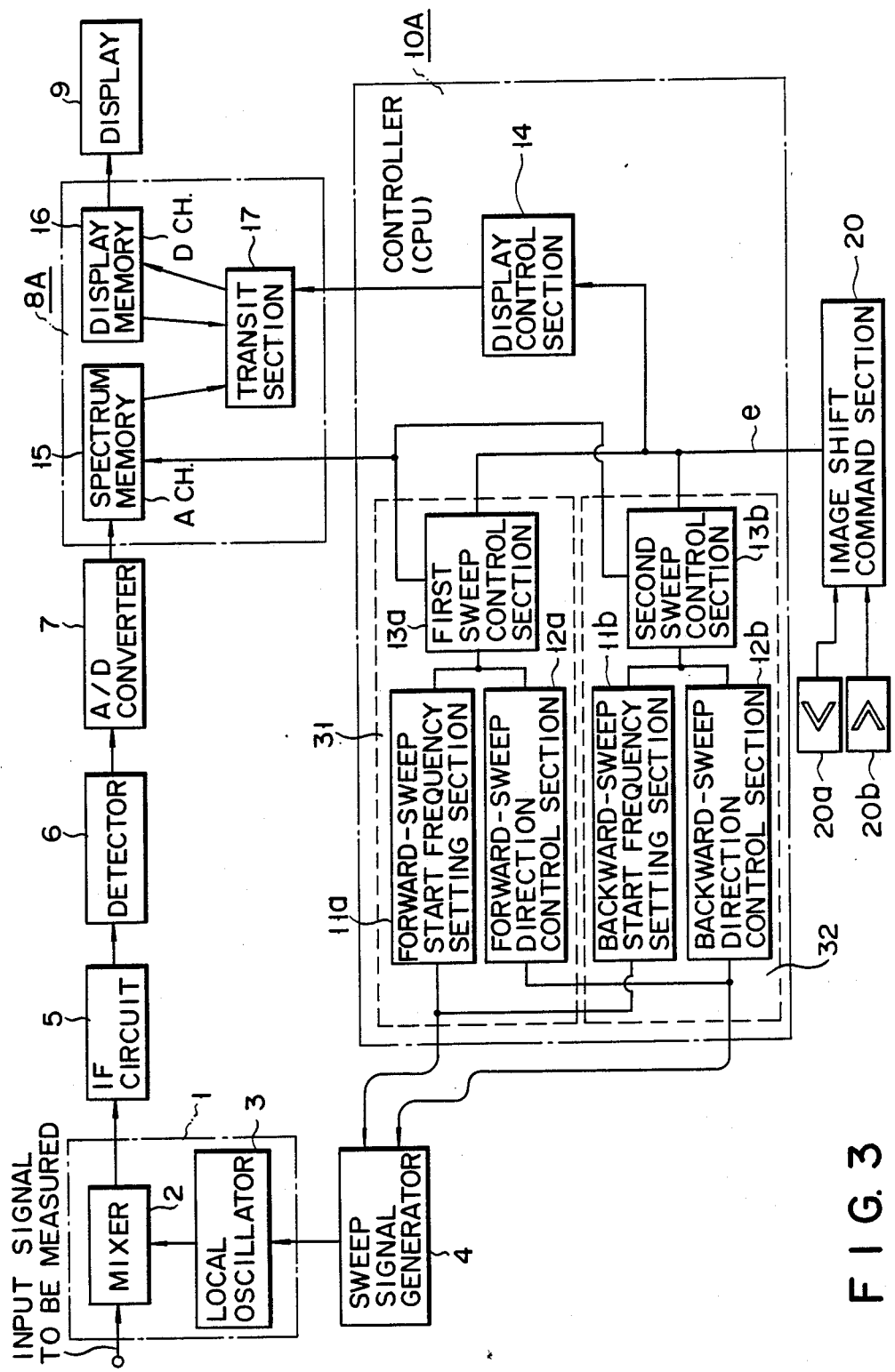
F I G. 3

SIGNAL ANALYZER HAVING PARTIALLY SCROLLING FUNCTION FOR DISPLAY SCREEN

BACKGROUND OF THE INVENTION

1. Field of the Invention

This invention relates to a signal analyzer and, more particularly, to a sweep measuring type signal analyzer such as a spectrum analyzer (including an optical spectrum analyzer), a network analyzer, and the like, which has a partially scrolling function for a screen that displays a measurement result.

Further, this invention relates to a signal analyzer such as a spectrum analyzer, used for spectrum analysis of a signal to be measured and, more particularly, to a signal analyzer with which an operator can easily obtain a display of data at a frequency outside a currently displayed frequency range in a visible format.

2. Description of the Related Art

A conventional spectrum analyzer normally employs a two-dimensional coordinate system wherein a frequency is plotted along the abscissa and a level of an analyzed signal is plotted along the ordinate. In this case, in order to adjust the frequency axis at a desired position, or in order to sequentially scan and observe data on the left or right side of a current display, data along the frequency axis is sometimes shifted in either direction. In general, the sequential shifting of data on the display screen is called a scrolling operation names after development of a "scroll". This ivention relates to a spectrum analyzer having a scrolling function which is easy to operate for an operator.

A typical scrolling function of a conventional display is (1) a scrolling function of a computer graphic display for shifting the display content on a display screen in the vertical direction in units of characters or dots. Another typical scrolling function is (2) a function of changing display data by half a display screen as a function similar to the scrolling function. The operation is as shown in FIGS. 1A and 1B. More specifically, FIG. 1A shows a left-shift operation for shifting an image toward a lower frequency along the frequency axis. FIG. 1B shows a right-shift operation for shifting an image toward a higher frequency along the frequency axis. In either case, an image (indicated by dotted lines a, b, and c) before a half-screen shift command is input is subjected to sweeping from d after the half-screen shift command is input. In this case, data are sequentially updated from the left end of the sweeping (in the order defined by d, e, and f), and an image indicated by a solid line is obtained. Therefore, initial data still remain on an unswept portion (portion of b-c when portion of a is swept, i.e., a portion wherein no data is updated). After sweeping is completed (upon completion of half-screen shifting), desired data (indicated by a solid line defined by d, e, and f) appears on the screen.

The related arts (1) and (2) respectively have the following problems. In the related art (1), the scrolling function of the computer graphic display has different properties from those of a scrolling function of a spectrum analyzer in which an unknown signal is measured while being swept and a measurement result must be displayed, and this function cannot be directly used.

The half-screen shift function of the related art (2) has the following two problems. (i) A frequency sweep rate has a physical limitation determined by a bandwidth inside a spectrum analyzer, and cannot be infinitely increased. Therefore, a portion to be observed cannot be reached faster than the sweep rate due to the above limitation. In other words, if the sweep rate is low, measurement cannot be immediately performed. In the case of FIG. 1A, a right-half screen is to be observed when the left-shift operation is performed. During the sweep time of the left-half screen, the right-half screen to be observed does not appear. That is, the left-half screen is an unnecessary portion for the operator. In the case of FIG. 1B, when data adjacent to the left end of the screen is to be observed by a right-shift operation, a desired screen does not appear until almost all the left-half screen sweep operation is completed. (ii) Data before and after scrolling cannot be continuously observed. In particular, in the case of the right-shift operation of FIG. 1B, although new data is to be observed as data continuous with the data before scrolling in the left direction, new data appears from the left end to the right. More specifically, a direction to be observed along the frequency axis, i.e., sweeping (from the right to the left) opposite to normal left-to-right sweeping cannot be performed, resulting in inconvenience.

SUMMARY OF THE INVENTION

It is, therefore, an object of the present invention to provide a new and improved signal analyzer having a partially scrolling function for a display screen which can be scrolled so that non-displayed measurement data near one side of the screen and requested by an operator, can be continuously displayed.

According to the present invention, there is provided a signal analyzer comprising:

input processing means for processing an input signal to be measured so as to output a predetermined digital signal corresponding to a predetermined frequency sweep range;

memory means, connected to the input processing means, for storing the predetermined digital signal;

display means, connected to the memory means, for displaying the predetermined digital signal stored in the memory means as an image which is developed along a frequency axis;

scroll command means for providing a command for shifting the image displayed on the display means in a predetermined direction along the frequency axis by a predetermined distance; and control means, connected to the input processing means, the memory means, and the scroll command means, for supplying, prior to receiving a scroll command, control signals to the input processing means, for causing the input processing means to process the input signal to be measured in a first frequency sweep range and to the memory means, for causing the memory means to store the predetermined digital signal. When the command from the scroll command means is received, the control means supplies control signals to the input processing means, for causing the input processing means to process the input signal to be measured in a second frequency sweep range in accordance with a content of the scroll command, and to the memory means; for causing an address range of the memory means to shift and the memory means to store the predetermined digital signal. The display means is thus enabled to display an image of the second frequency sweep range continuously with the image of the first frequency sweep range which is shifted in accordance with the command.

BRIEF DESCRIPTION OF THE DRAWINGS

These and other objects and features of the present invention can be understood through the following embodiments by reference to the accompanying drawings, in which:

FIG. 3 is a block diagram showing another embodiment of the present invention;

DETAILED DESCRIPTION OF THE PREFERRED EMBODIMENTS

In a spectrum analyzer to which the present invention is applied, a level of an input signal to be measured corresponding to a frequency is stored in a memory; a function of displaying the level of the input signal to be measured stored in the memory as an image corresponding to the frequency on a display means is provided; an image shifting means allowing an operator to designate and input a shift direction and a shift width of an image and a means for displaying an image which is obtained by shifting the display image toward a higher or lower frequency along the frequency axis for the designated width are arranged; and a means for controlling and driving these means is arranged to have a control function. In this control function, if a desired image shift direction corresponds to a higher (or lower) frequency direction along the frequency axis, in other words, is a right (or left) shift direction, a level of the input signal to be measured lower than a minimum frequency (or higher than a maximum frequency) of an image before shift designation is stored in the memory, and a waveform image is displayed to form a waveform continuous with an end of a waveform after shift designation in respects of frequency and level. Thus, the scrolling function of the present invention is realized.

In order to provide the scrolling function of the present invention, a microcomputer is preferably utilized. The scrolling function is preferably realized by the following operation procedures. [1] Keys on an operation panel consist of right- and left-direction designation keys, and the scrolling function can be realized upon depression of either of these keys (scrolling mode setting). [2] When a key is kept depressed, the scrolling mode is continued, and the screen is continuously scrolled (continuation of scrolling mode). [3] When a direction designation key different from the current key is depressed, the scrolling mode (left-shift or right-shift) can be switched at that time. The above-mentioned operation procedures include a function of desirably setting an image shift direction and a shift width by an operator. [4] A function of adjusting a scrolling rate in correspondence with a frequency sweep rate of a given frequency range used for spectrum analysis in the frequency range can also be provided. [5] When the depressed key is released, the scrolling mode is canceled. Note that when the scrolling mode is canceled, sweeping is restarted from, e.g., the left end.

Some embodiments of the present invention based on the above principle will be described with reference to the accompanying drawings.

Figure 1A:
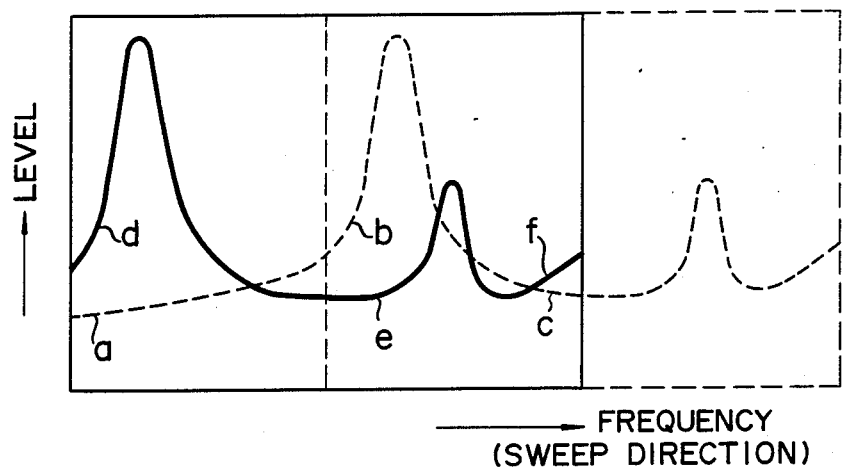
FIGS. 1A and 1B are views showing display screens according to the related arts.
Figure 1B:
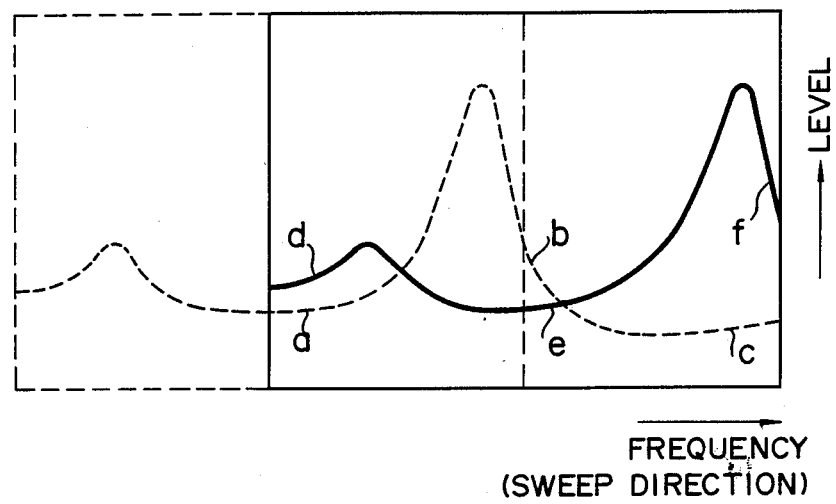
Figure 2:
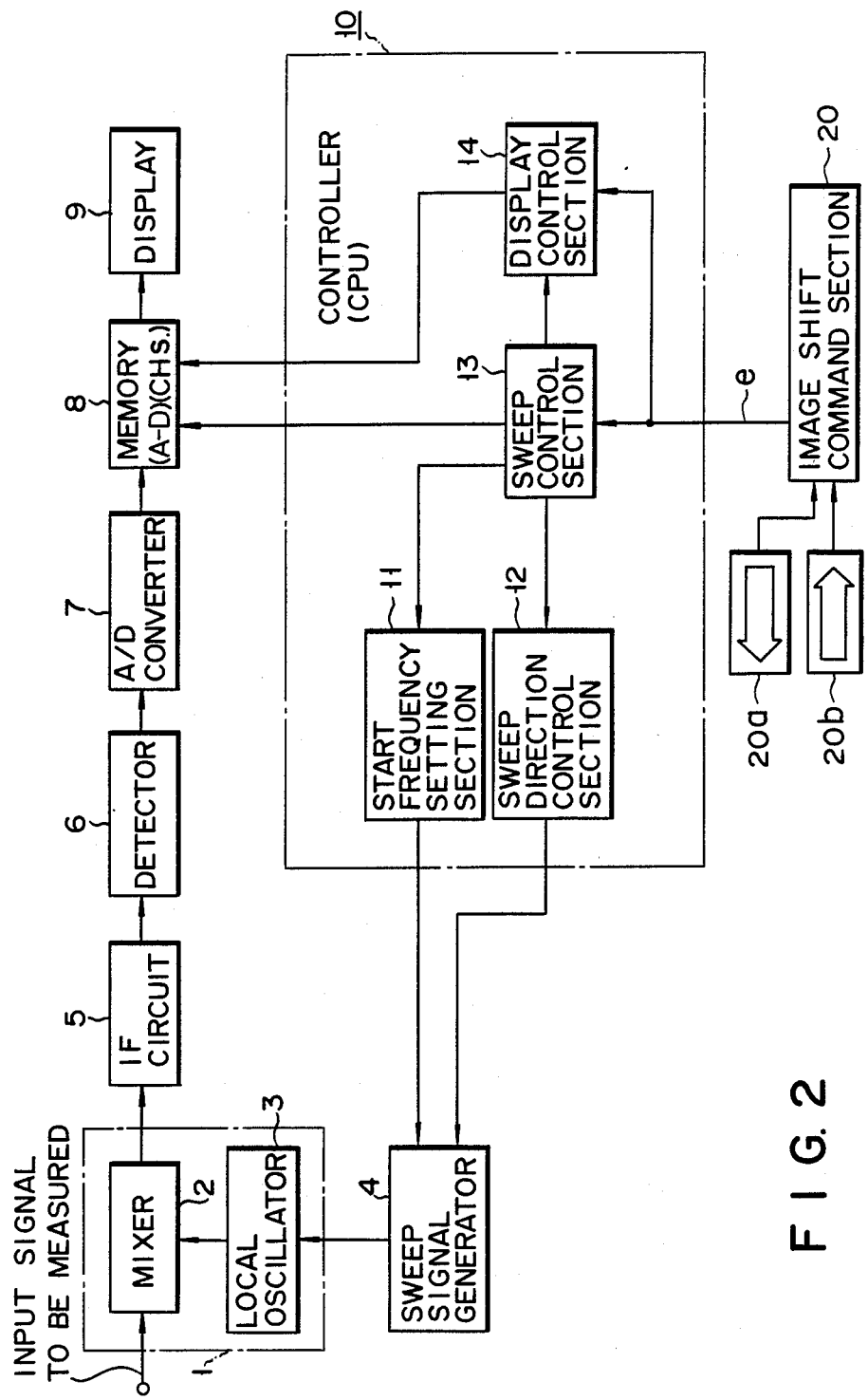
FIG. 2 is a block diagram showing a first embodiment of the present invention.

FIG. 2 is a block diagram showing an arrangement of a spectrum analyzer having a scrolling function according to a first embodiment of the present invention. Frequency converter 1 for frequency-converting an input signal to be measured comprises mixer 2 and local oscillator 3. Local oscillator 3 is connected to sweep signal generator 4 including, e.g., a PLL in order to sweep the oscillation frequency of oscillator 3. The output from frequency converter 1 is detected by detector 6 through intermediate frequency (IF) circuit 5. The detected output is converted into a digital level signal by A/D converter 7, and is then stored in memory 8. More specifically, the level of a signal to be measured which is to be output from a spectrum analyzer is stored corresponding to the frequency of the input signal to be measured. The content of memory 8 is displayed on display 9. The abscissa of this display corresponds to a frequency axis, and the ordinate represents levels of an input signal to be measured. The sweeping and read/write access of the memory are controlled by controller 10. Controller 10 preferably comprises a microprocessor (CPU). Controller 10 includes the following four functional blocks.

Start frequency setting section 11 sets a start frequency corresponding to a start end of a frequency range to be observed, and supplies a command to sweep signal generator 4 so that a sweep signal is generated from the start frequency in a higher or lower frequency direction.

Sweep direction control section 12 supplies a command to sweep signal generator 4, so that a sweep signal is to be generated from the start frequency in either the higher or lower frequency direction.

Sweep control section 13 receives a command signal for setting a desired image shift direction and a desired image shift width from image shift command section 20, and supplies a corresponding sweep direction command to sweep direction control section 12 when a waveform image on the display screen of display 9 is shifted by a designated frequency range. Section 13 also supplies a command for setting a start frequency to start frequency setting section 11, and supplies, to memory 8, a signal for controlling an address of memory 8 for storing the input signal to be measured converted to the digital level signal.

Display control section 14 receives a command signal for designating a desired image shift direction and a desired image shift width from image shift command section 20, and controls a read address of memory 8 so that an image corresponding to the command is formed on display 9.

FIG. 3 is a block diagram showing an arrangement of a spectrum analyzer having a scrolling function according to a second embodiment of the present invention. The major difference from FIG. 2 is that the interior of memory 8A is divided into two functional portions. Spectrum memory 15 for storing a digital value representing the level of an input signal to be measured and display memory 16 for storing data for display 9 are arranged. For example, but without limitation, spectrum memory 15 may have a capacity of one display frame, while display memory 16 may have a capacity of three frames. See FIG. 8. Transit section 17 connects these memories 15 and 16. Upon reception of a control signal from display control section 14 in controller 10A, section 17 transfers a data content required for display from spectrum memory 15 to display memory 16. Section 17 extracts data from display memory 16, and returns the extracted data after the addresses are shifted in accordance with an image shift width. In this manner, since the memory is divided into two functional blocks, and transit section 17 is arranged therebetween, display 9 can scroll an image to be displayed using an identical read address range of display memory 16. The second embodiment is convenient for a case wherein the display memory range is limited. However, the scrolling rate is relatively low, i.e., 2 points per 50 ms (500 points are shifted in 12.5 sec). However, if a sweeping rate is originally low, there is no problem if the scrolling rate is low.

Attention must be paid to the relationship between an image shift direction and a sweep direction. In each embodiment described above, when the sweep direction is set opposite to the image shift direction, a display is continuous and is easy to see. However, the sweep direction is not limited to this. When digital level data of an input signal to be measured is stored in the memory, an image to be formed on the screen after the shift operation is sequentially stored from the lower or upper portion of the image, thus reversing a direction. However, if either direction is empoyed, a waveform image for which the frequency axis and the level axis are continuous is preferably displayed on the screen after the shift command is executed. In this case, the sweep direction can be set opposite to the employed direction.

In FIG. 3, first control unit 31 in controller 10A comprises forward sweep start frequency setting section 11a, forward sweep direction control section 12a, and first sweep control section 13a. Second control unit 32 comprises backward sweep start frequency setting section 11b, backward sweep direction control section 12b, and second sweep control section 13b. Thus, after the display screen is shifted, an image can be continuously displayed.

In FIGS. 2 and 3, reference numeral 20 denotes an image shift command section. Section 20 selectively receives commands from scroll keys 20a and 20b for commanding left or right shift operation on the screen of display 9, and outputs, to sweep control section 12, a command signal for setting a desired image shift direction and a desired image shift width.

Figure 4A:
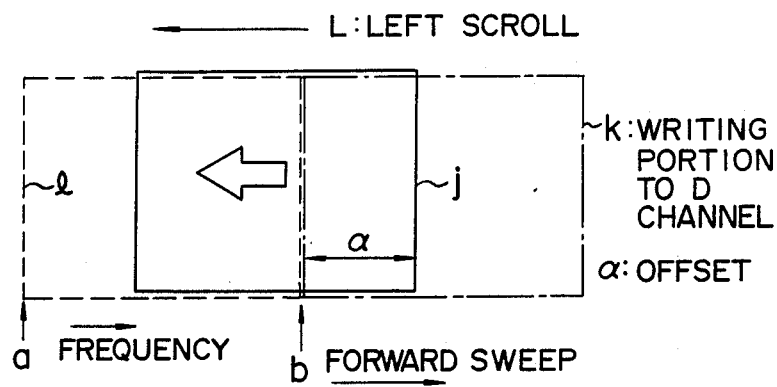
FIGS. 4A to 4D are views showing movement (left direction) of a screen appearing on a display according to the present invention.
Figure 4B:
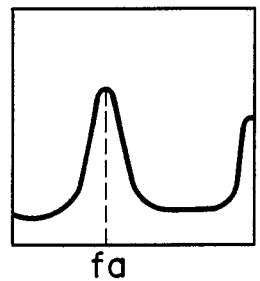
Figure 4C:
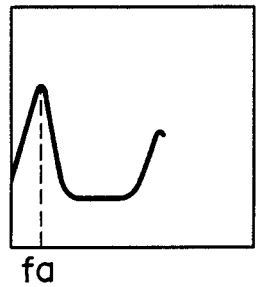
Figure 4D:
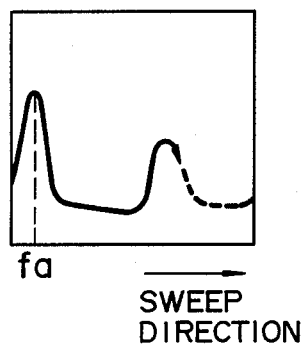

The principle of the scrolling function of the present invention will be described as movement on the display screen with reference to FIGS. 4A to 4D and FIGS. 5A to 5D. A left scrolling operation will be described with reference to FIGS. 4A to 4D. FIG. 4A shows an image range displayed on the frequency axis before and after the scrolling is started. A dotted line represents an image range (l) displayed on the screen before the scrolling is started, and a solid line represents a portion (j) currently stored in an A-channel of a memory (in particular, corresponding to memory 8 in the first embodiment), and corresponds to a currently displayed portion. Reference symbol a in FIG. 4A indicates a sweep start frequency position before the scrolling is started; and b, a sweep start frequency at the beginning of scrolling. The memory also includes B, C, and D channels. Of these channels, the B and C channels are not used for the scrolling function. The B channel can store a spectrum waveform as in the A channel, and can provide the data for display. The C channel is a memory area used for, e.g., a waveform calculation. In the D channel, a frequency range (k) indicated by an alternate long and short dashed line is sequentially written from the left side (it is convenient for use when data is written from the left side, but the writing direction is not limited to this). Each channel of the memory can store data of 501 points of addresses "0" to "500". From another point of view, a display image before scrolling corresponds to FIG. 4B, a display image at the beginning of scrolling corresponds to FIG. 4C, and a display image during scrolling corresponds to FIG. 4D. The image shown in FIG. 4C includes a non-display portion, and this portion is sequentially displayed from the left as indicated by the dotted line in FIG. 4D and finally fills the screen.

Right scrolling will be described with reference to FIGS. 5A to 5D.

Figure 5A:
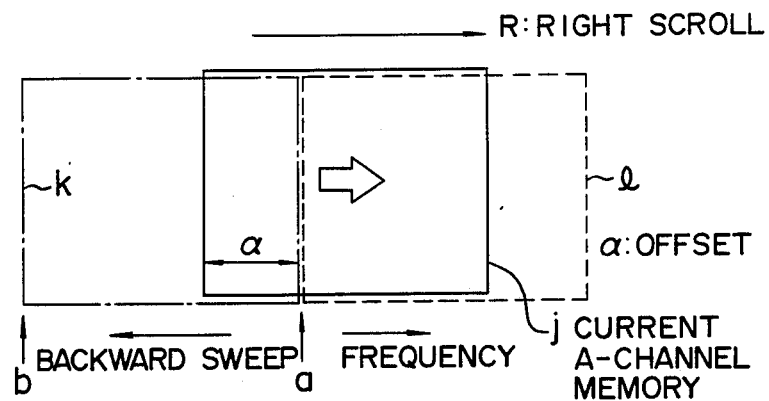
FIG. 5A to 5D are views showing movement (right direction) of a screen appearing on the display according to the present invention.
Figure 5B:
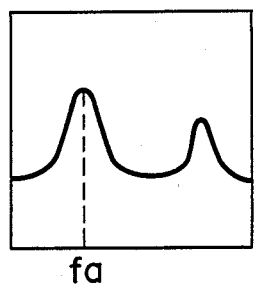
Figure 5C:
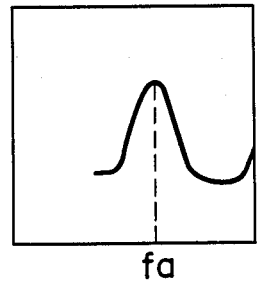
Figure 5D:
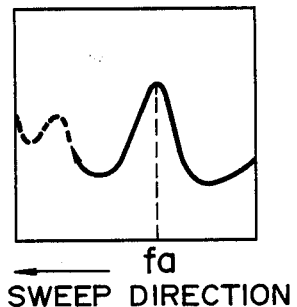

The major difference from FIGS. 4A to 4D is as follows. In FIG. 4A, frequency sweeping is performed from the sweep start frequency position b during scrolling in the forward direction (right direction), an data is written in the D channel of the memory (forward sweeping). In contrast to this, in FIG. 5A, frequency sweeping is performed from the sweep start frequency position a during scrolling in the backward direction (left direction), and data is written in the D channel of the memory (backward sweeping). In FIG. 5D showing a shifted state of the screen, a display image indicated by a dotted line extends to the left, as indicated by an arrow. When the sweep start frequency coincides with the left end of the A-channel memory during scrolling, the sweep start frequency is shifted again, and the content of the D channel is rewritten.

An actual operation using a microprocessor (CPU) as controller 10 or 10A for controlling the scrolling mode will be described.

[1] When scroll key 20a or 20b on the operation panel (not shown) is depressed for the first time (when a command signal is output from image shift command section 20): (1) A scrolling mode flag is set in the CPU. (2) When the left scrolling is selected, a span is added to the sweep start frequency to set a new sweep start frequency, and the phase lock loop (PLL) of sweep signal generator 4 is locked at zero level, so that sweeping is performed in the forward direction (along which a frequency increases) (FIG. 4A). In contrast to this, when the right scrolling is selected, a span is subtracted from the sweep start frequency to set a new sweep start frequency, and the PLL circuit is locked at maximum level, so that sweeping is performed in the backward direction (along which a frequency decreases). (3) A flag is set so that sweep data is written in the D channel of the memory.

[2] When scroll key 20a or 20b on the operation panel is kept depressed: the CPU starts the following execution routine for every 50 msec. (1) The CPU checks whether or not the X address of sweeping advances by 2 points or more. (i) If the X address is +0 or +1, control is returned. (ii) If the X address is +2 or more, the routine is executed. (2) The CPU interrupts a display processor (equivalent to display controller 14 in the CPU), and causes it to perform screen scrolling. (3) The CPU causes the display processor to update the center frequency (or start frequency) of display, and a marker frequency of display. (4) If offset α of scrolling has reached 500 points, the start frequency is updated.

(The same operation as in (2) in [1] is performed.) (5) When the scroll key is released, the scrolling mode flag is reset, and the start frequency is updated. Then, the normal sweeping is performed.

Figure 6:
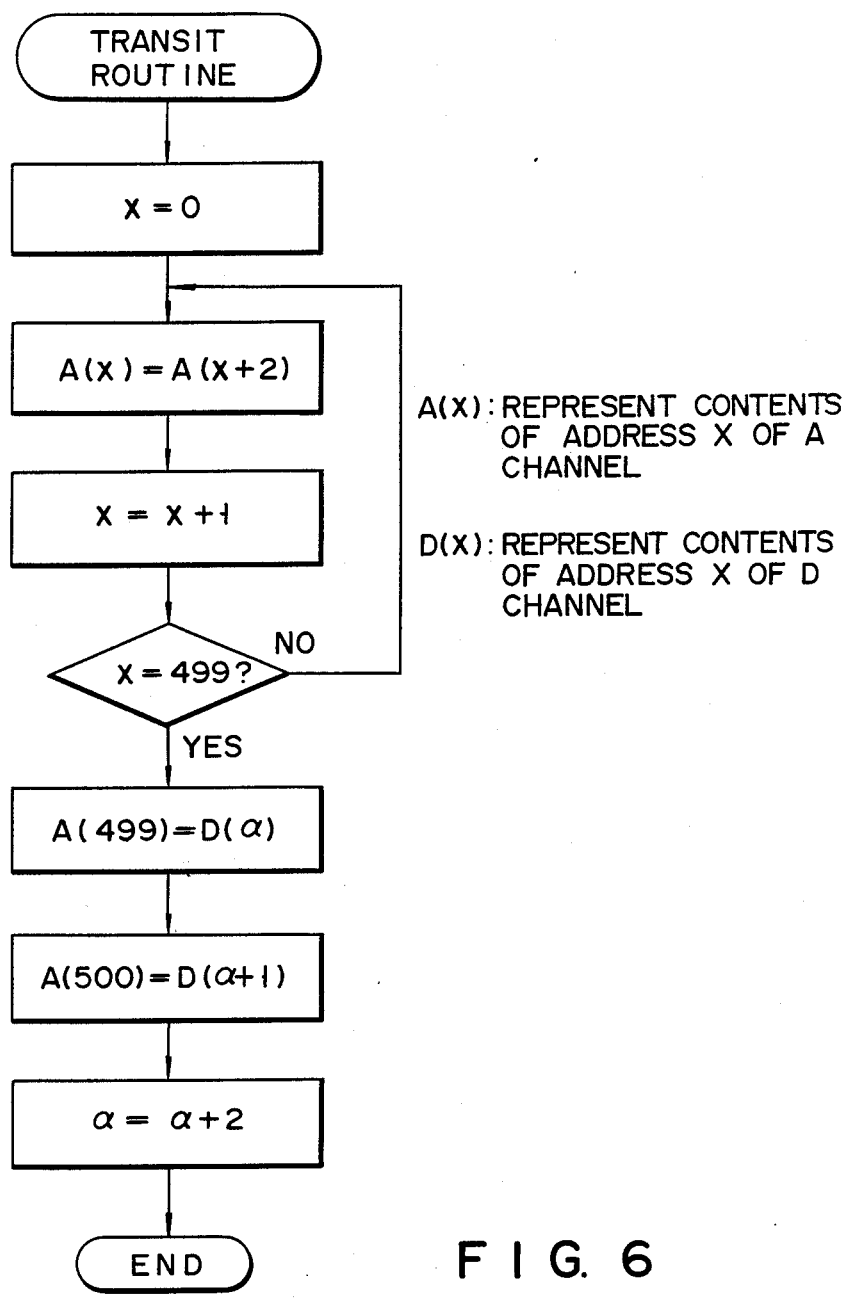
FIG. 6 is a flow chart for explaining a rewriting operation of a spectrum image memory for scrolling data on a screen.

Data transfer between spectrum memory 15 (corresponding to the A channel) and display memory 16 (corresponding to the D channel) shown in FIG. 3 will be described as the function of the display processor. In the scrolling of a display on the screen, the following operation is performed by the display processor upon interruption from the microprocessor for controlling the scrolling mode. More specifically, when offset α of scrolling is set, data transfer from A and D channels of the memory to the A channel is executed through transit section 17 in order to shift the screen by 2 points, as shown in FIG. 6.

The scrolling can be performed not only by the A channel but also by the B channel. When the right scrolling is selected, only normal (forward) sweeping starting from the left end can be performed without performing backward sweeping.

Figure 7:
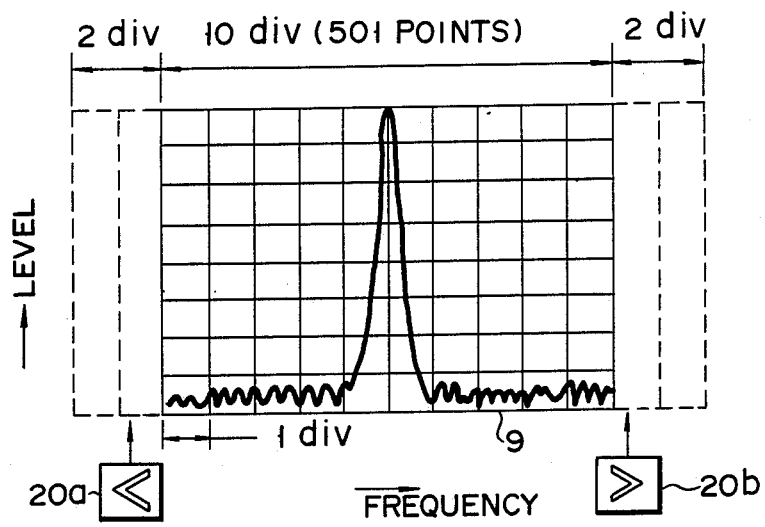
FIGS. 7 and 8 are views for explaining other functions of a processor according to the present invention.
Figure 8:
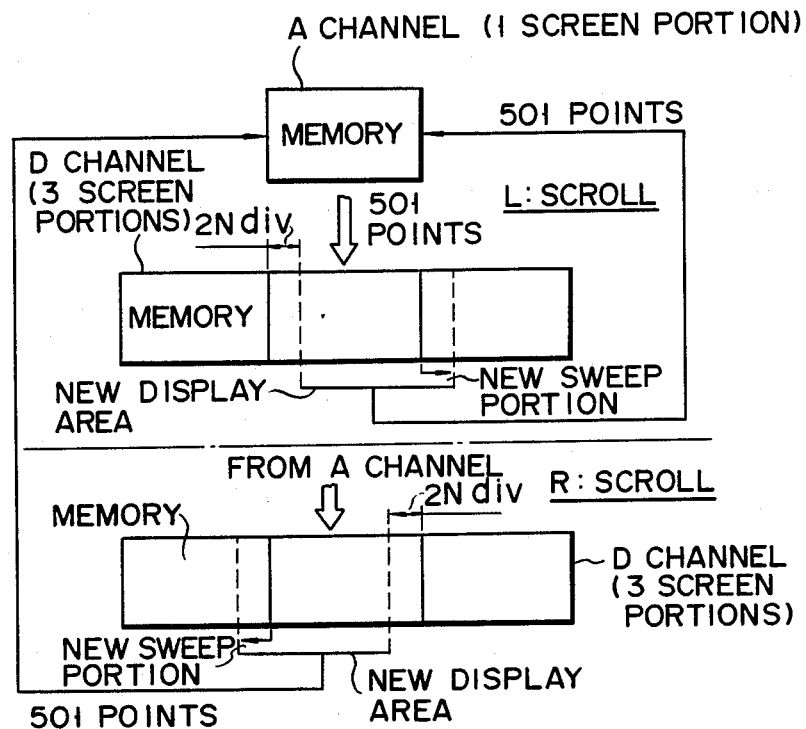

Furthermore, the function of the microprocessor (CPU) used as controller 10 or 10A may be executed as follows (FIGS. 7 and 8).

[1] When a scroll key (20a or 20b) is successively depressed N times (where N is 1 to 5, and if the key is depressed 5 times or more, processing is performed assuming N=5): (1) the CPU sets the scrolling mode flag. (2) In the case of left scrolling, an image is shifted to the left by 2 N div. The shift operation is performed such that data corresponding to 501 points are transferred from the A (or B) channel to the D channel, and the data are read out and displayed after the addresses are shifted in the D channel. In this case, when the shift operation is performed 5 N times each by 20 points, 100 N points, i.e., a 2 N div. shift can be performed. A span is added to the original sweep start frequency to set a new sweep start frequency, and the sweeping is performed by 2 N div. Upon this sweeping, spectrum data is written in the D channel, and is displayed. After the sweeping for 2 N div. is performed, data for 501 points are transferred from the D channel to the A channel. An N/5 span is added to the original sweep start frequency to reset the scrolling mode flag, and the normal sweeping is then performed. (3) In the case of right scrolling, an image is shifted to the right by 2 N div. in the same manner as described above. Then, data for 501 points are transferred from the D channel to the A channel, and an N/5 span is subtracted from the original sweep start frequency to set a new sweep start frequency. Then, the scrolling mode flag is reset, and the sweeping is started.

[2] When the scroll key is kept depressed, processing is performed assuming N=1, and a repeat function of the scroll key described above is not provided.

In the above description of the embodiments, the spectrum analyzer has been exemplified. However, the present invention can be applied to other apparatuses (an optical signal measuring apparatus, a transmission characteristic measuring apparatus, and the like).

According to the present invention, when a display screen of a spectrum analyzer is shifted to either the left or right, a forward or backward waveform is sequentially swept and is drawn from a position of a maximum or minimum frequency of an image before a shift command is generated. Therefore, the following advantages can be provided.

(1) An operator can quickly obtain data around (on the left- or right-hand side of) currently displayed data.

(2) Since an image is shifted for a currently displayed image in accordance with a shift along the frequency axis (i.e., a display frequency range is updated), and the relationship between the waveform and the frequency can be maintained, the display is not misleading.

(3) A new waveform can be continuous with a currently displayed waveform in respects of the frequency axis and level. Thus, continuous observation of the waveform can be attained. This advantage allows quick and continuous appearance of data at the left end, which is drawn in the case of right scrolling. The operator (of the spectrum analyzer) can be satisfied greatly.

What is claimed is:

1. A signal analyzer, comprising:

input processing means for processing an input signal to be measured so as to output a predetermined digital signal corresponding to a predetermined frequency sweep range;

memory means, coupled to said input processing means, for storing the predetermined digital signal;

display means, coupled to said memory means, for displaying the predetermined digital signal store in said memory means as an image which is developed along a frequency axis;

scroll command means for providing a command for shifting the image displayed on said display means in a predetermined direction along the frequency axis by a predetermined distance; and control means, coupled to said input processing means, said memory means, and said scroll command means, said control means being operative in a selected one of two modes wherein, in a first mode prior to receiving a command from said scroll command means, said control means supplies to said input processing means a first control signal for causing said input processing means to process the input signal to be measured in a first frequency sweep range, and supplies to said memory means a second control signal for causing said memory means to store and read-out the predetermined digital signal, and wherein, in a second mode when the command from said scroll command means is received, said control means (a) supplies to said memory means a third control signal for causing an address range of said memory means to shift and for reading out of said memory means the predetermined digital signal corresponding to a portion of said first frequency sweep range in accordance with a content of said command, (b) supplies to said input processing means a fourth control signal for causing said input processing means to process the input signal to be measured in a second frequency sweep range in accordance with the content of the command, and (c) supplies to said memory means a fifth control signal for causing said memory means to store and read-out the predetermined digital signal corresponding to said second frequency sweep range, wherein a first display condition is set on said display means in said first mode to display an image based on said first frequency sweep range; and a second display condition is set in said second mode in which the displayed image of said predetermined digital signal in said first frequency sweep range is shifted to a display portion in a predetermined direction relative to the displayed image in the first display condition in accordance with said command, while a remaining display portion is defined at the opposite side of the shift direction, and said predetermined digital signal in said second frequency sweep range is displayed successively on said remaining display portion, allowing said display means to display an image of the second frequency sweep range continuously with the image of the first frequency sweep range which is shifted in accordance with the command.

2. A signal analyzer according to claim 1, wherein said input processing means comprises:
frequency sweep signal generating means for generating a frequency sweep signal in a predetermined range;
frequency converting means for receiving the frequency sweep signal of the predetermined range from said frequency sweep signal generating means and converting and outputting the input signal to be measured into a signal having a predetermined frequency;
detecting means for detecting an output from said frequency converting means; and
A/D conversion means for converting the detected signal from said detecting means into the corresponding digital signal.

3. A signal analyzer according to claim 1, wherein said control means comprises:
start frequency setting means for setting a sweep start frequency of the first and second frequency sweep ranges, and outputting the sweep start frequency in association with the first and fourth third control signals;
sweep direction setting means for setting a sweep direction indicating that sweeping is performed from the sweep start frequency in either a higher or lower frequency direction, and outputting the sweep direction in association with the first and fourth control signals;
sweep control means for outputting, in association with the second and fifth control signals, a signal for controlling said start frequency setting means and said sweep direction setting means in accordance with the command from said scroll command means and for controlling a storage address of said memory means; and
display control means for outputting, in association with the second and fifth control signals, a signal for controlling a read address of said memory means in order to display the image on said display means in accordance with the command from said scroll command means.

4. A signal analyzer according to claim 1, wherein said scroll command means has two scroll keys for selectively designating left and right scrolling operations.

5. A signal analyzer according to claim 4, wherein said scroll command means includes image shift width setting means for shifting the image along the frequency axis by a predetermined width in a corresponding direction each time said scroll keys are operated once.

6. A signal analyzer according to claim 5, including means for causing the number of effective successive operations of each of said scroll keys to be limited to a predetermined value.

7. A signal analyzer according to claim 6, wherein the predetermined width corresponds to two display divisions when the frequency axis of said display means corresponds to ten divisions.

8. A signal analyzer according to claim 7, wherein the number of effective operations of said scroll keys is 5.

9. A signal analyzer according to claim 1, wherein said memory means includes a first memory portion for storing the predetermined digital signal corresponding to the input signal to be measured, a second memory portion for storing data for a display of said display means, and transit means for connecting said first and second memory portions.

10. A signal analyzer according to claim 9, wherein said first memory portion has a memory capacity corresponding to one frame of said display means, and said second memory portion has a memory capacity corresponding to three frames of said display means.

11. A signal analyzer, comprising:
a memory having a number of memory areas, for storing in one of said memory areas, in a first operating mode, digital level data of an input signal to be measured corresponding to a frequency;
display means for displaying the level data stored in said memory as an image corresponding to the frequency;
image shift means for shifting, in a second operating mode, the image displayed by said display means in a desired one of higher and lower frequency shift directions along a frequency axis; and
control means coupled to said memory and said image shift means, for causing, in said second operating mode, another area of said memory to store digital level data of an input signal to be measured lower than a minimum frequency or higher than a maximum frequency of a current image which is displayed, in correspondence with the higher or lower frequency shift direction, and for causing said display means to display the stored level of the input signal to be measured continuously with an end of the shifted image;
wherein a first display condition is set on said display means in said first operating mode to display an image based on a first frequency sweep range; and a second display condition is set in said second operating mode in which the displayed image of said digital level data in said first frequency sweep range is shifted to a display portion in a corresponding shift direction, while a remaining display portion is defined at the opposite side of the shift direction and digital level data corresponding to a second frequency sweep range is displayed successively on said remaining display portion.

12. A signal analyzer according to claim 11, wherein said control means includes first control means for, when the image is shifted by said image shift means in the lower frequency shift direction along the frequency axis, obtaining the level of the input signal to be measured corresponding to the maximum frequency or higher by forward sweeping.

13. A signal analyzer according to claim 11, wherein said control means includes second control means for, when the image is shifted by said image shift means in the higher frequency shift direction along the frequency axis, obtaining the level of the input signal to be measured corresponding to the minimum frequency or lower by backward sweeping.

14. A signal analyzer according to claim 11, wherein said control means includes first control means for, when the image is shifted by said image shift means in the lower frequency shift direction along the frequency axis, obtaining the level of the input signal to be measured corresponding to the maximum frequency or higher by forward sweeping, and second control means for, when the image is shifted by said image shift means in the higher frequency shift direction along the frequency axis, obtaining the level of the input signal to be measured corresponding to the minimum frequency or lower by backward sweeping.

* * * * *